(12) United States Patent
Sheafor

(10) Patent No.: US 9,772,648 B2
(45) Date of Patent: Sep. 26, 2017

(54) LOW POWER ASYNCHRONOUS COUNTERS IN A SYNCHRONOUS SYSTEM

(71) Applicant: Ambiq Micro, Inc, Austin, TX (US)

(72) Inventor: Stephen James Sheafor, Boulder, CO (US)

(73) Assignee: Ambiq Micro, Inc., Austin, TX (US)

( * ) Notice: Subject to any disclaimer, the term of this patent is extended or adjusted under 35 U.S.C. 154(b) by 72 days.

(21) Appl. No.: 14/918,406

(22) Filed: Oct. 20, 2015

(65) Prior Publication Data

US 2016/0109901 A1    Apr. 21, 2016

Related U.S. Application Data

(60) Provisional application No. 62/066,218, filed on Oct. 20, 2014.

(51) Int. Cl.

| *G06F 1/06* | (2006.01) |
|---|---|
| *G06F 1/12* | (2006.01) |
| *G06F 11/30* | (2006.01) |
| *G06F 11/34* | (2006.01) |
| *G06F 13/10* | (2006.01) |
| *G01R 19/00* | (2006.01) |
| *G05F 1/56* | (2006.01) |
| *H03K 17/687* | (2006.01) |
| *H03M 1/12* | (2006.01) |
| *H03L 7/00* | (2006.01) |
| *G06F 1/32* | (2006.01) |

(52) U.S. Cl.
CPC ............ *G06F 1/06* (2013.01); *G01R 19/0084* (2013.01); *G05F 1/56* (2013.01); *G06F 1/12* (2013.01); *G06F 1/3237* (2013.01); *G06F 1/3287* (2013.01); *G06F 11/3041* (2013.01); *G06F 11/3414* (2013.01); *G06F 13/102* (2013.01); *H03K 17/687* (2013.01); *H03L 7/00* (2013.01); *H03M 1/12* (2013.01); *Y02B 60/1228* (2013.01)

(58) Field of Classification Search
CPC ...... G06F 1/06; G06F 1/10; G06F 1/12; G06F 1/3237; G06F 1/3287; G06F 11/3041; G06F 11/3414; G06F 13/102; G06F 13/4213; G06F 13/4217; G05F 1/56; H03K 17/687; H03L 7/00; H03M 1/12; Y02B 60/1228; H04L 7/0008; G04G 7/00; G08C 15/00; G01R 19/0084
USPC .................................. 713/400, 500; 375/354
See application file for complete search history.

(56) References Cited

U.S. PATENT DOCUMENTS

| 5,233,638 | A | * | 8/1993 | Moriwaki | ............... | H03K 5/13 327/202 |
|---|---|---|---|---|---|---|
| 7,360,109 | B2 | | 4/2008 | Saitoh | | |
| 2010/0085220 | A1 | * | 4/2010 | Zhang | .................... | H03K 21/12 341/63 |
| 2011/0204946 | A1 | * | 8/2011 | Shori | ................... | G11C 7/1006 327/160 |
| 2014/0203850 | A1 | | 7/2014 | Herbeck et al. | | |

* cited by examiner

*Primary Examiner* — Kim Huynh
*Assistant Examiner* — Aaron J Browne

(57) ABSTRACT

A clock synchronizer adapted to synchronize reading a Timer that is clocked asynchronously to the system clock.

8 Claims, 10 Drawing Sheets

US 9,772,648 B2

1

LOW POWER ASYNCHRONOUS COUNTERS IN A SYNCHRONOUS SYSTEM

CROSS REFERENCE TO RELATED APPLICATIONS

This application is related to the following:
1. Provisional Application Ser. No. 62/066,218, filed 20 Oct. 2014 ("Parent Provisional");
2. PCT Application No. PCT/US15/50239 filed 15 Sep. 2015 ("Related Application 1");
3. U.S. application Ser. No. 14/855,105, filed 15 Sep. 2015 ("Related Application 2");
4. U.S. application Ser. No., filed simultaneously herewith ("Related Application 3");
5. U.S. application Ser. No., file simultaneously herewith ("Related Application 4"); and
6. U.S. application Ser. No., filed simultaneously herewith ("Related Application 5").

This application claims priority to the Parent Provisional, and hereby claims benefit of the filing date thereof pursuant to 37 CFR §1.78(a)(4).

The subject matter of the Parent Provisional and the Related Application, each in its entirety, is expressly incorporated herein by reference.

BACKGROUND OF THE INVENTION

1. Field of the Invention

The present invention relates to low power autonomous peripheral circuits and methods. The novel low power autonomous peripheral circuits and methods are suitable for use in low power microprocessors, microcontrollers, or power management devices.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application,

2 the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single integrated circuit chip. In the Related Application, I have disclosed circuits adapted to operate in the sub-threshold domain.

Shown by way of example in FIG. 2 is a typical single-chip microcontroller unit ("MCU") 12 comprising: a central processing unit ("CPU") 14; at least one random-access memory ("RAM") facility 16; at least one Flash memory ("Flash") facility 18; one or more timers ("Timers") 20; at least one input/output master ("I/O Master") facility 22; at least one input/output slave ("I/O Slave") facility 24; at least one analog to digital converter ("ADC") facility 26; a power management unit ("PMU") 28; and a clock generator ("Clock Generator") facility 30. A system bus ("System Bus") 32 interconnects the several MCU facilities 14-30, and a clock distribution bus ("Clock Bus") 34 distributes all clock signals developed by the Clock Generator 30 to the respective clocked facilities. As is known, development of the several clocks is generally controlled by information written to one or more control registers within Clock Generator 30 via the System Bus 32, and by system power state information typically provided by the PMU 28.

In low power systems, it is very desirable to have asynchronous counters, which are either driven from a clock asynchronous to the processor or are ripple counters (or both). However, it is often necessary to read these counters precisely from the processor. The counters must count correctly as the processor clock is enabled and disabled. This invention provides a method for resolving all of these issues.

FIG. 3 illustrates, in block diagram form, a typical timer facility configuration The timer is an N-bit counter which may be loaded with some initial value (possibly only zero) by software, and which then counts clock pulses from a selected clock source. It is desirable that the value in the Timer may be read via software at any time, even when the Timer is being clocked. The CPU Bus Interface is clocked on the system clock BCLK, and the data from the Timer must be supplied to it synchronously. If Clock1, Clock2, and Clock3 are all generated synchronously to BCLK, i.e. from the same source clock, this system will work correctly because the Timer will change synchronously to the read clock BCLK. This assumes that the Timer is implemented as a synchronous counter.

In systems which are focused on low power, there are often two factors which introduce difficulties into the above architecture. The first factor is that the source clocks for the various timer clocks, Clock1, Clock2, and Clock3, may not be the same as the source clock which creates BCLK. This may be because, for example, the Timer requires a more accurate clock, such as one generated from a Crystal Oscillator, while the source of BCLK is a less accurate but higher frequency RC Oscillator. It may also be because the source oscillator for BCLK is a high power device and the Timer can use a much lower frequency and much lower power source oscillator. The result of this architecture is that Clock1, Clock2, and Clock3 may not be synchronous to BCLK. The second factor is that for low power, the system must be able to stop the system clock BCLK, and enter a low power state typically referred to as "sleeping". However, the Timer clocks must continue to run even when the system is sleeping, and no clock pulses to the Timer can be added or dropped as the system moves between "sleeping" states where BCLK is not active and "running" states where BCLK is active.

These two requirements make reading the Timer correctly in every situation challenging. The prior art has handled this in several ways. The first way is to simply admit that precise reads are not possible, and require software to read the Timer multiple times until a value is read which is believed to be consistent. For low frequency timer clocks this is a workable but adds some software complexity. If the Timer clock frequency is in the same range as the frequency of BCLK, it may take a number of reads in order to produce a valid result. The second way is to require the source oscillator of BCLK to run at all times that the Timer is being clocked, even if the system is in a "sleeping" power state. In that case the Timer clock can be synchronized to the system clock at all times and reliable reads are possible. However, the high frequency source oscillator is often a major contributor to system power, and requiring it to remain active at all times can impose a significant power penalty. FIG. 4 illustrates, in block diagram form, a clock synchronization facility. This illustration shows Sync_clk is the always-running clock synchronous to BCLK. The selected source clock is synchronized in 2 flip-flops so the Clk_out is a stable clock of the same frequency as Clk_int. Note that in this implementation Clk_int must be no more than ½ of the frequency of Sync_clk.

What is needed is a method and apparatus adapted to provides a mechanism for clocking the Timer in such a way that a single read is always guaranteed to be correct but does not require the clock source oscillator to be active in "sleeping" power states, while consuming less power than known prior art.

BRIEF SUMMARY OF THE INVENTION

In one embodiment, an apparatus includes an internal clock coupled to a synchronizer facility, an enable coupled to said synchronizer facility, a synchronous clock coupled to said synchronizer facility, said synchronizer facility coupled to a timer, said synchronizer facility being adapted to output a first synchronized clock as a function of said internal clock, said synchronous clock, and said enable, and said timer being adapted to count as a function of said first synchronized clock.

A method comprising receiving an internal clock, receiving an enable, receiving a synchronous clock, developing a first synchronized clock as a function of said internal clock, said synchronous clock, and said enable, and counting as a function of said first synchronized clock.

BRIEF DESCRIPTION OF THE SEVERAL VIEWS OF THE DRAWINGS

The several embodiments may be more fully understood by a description of certain preferred embodiments in conjunction with the attached drawings in which.

Figure 1:
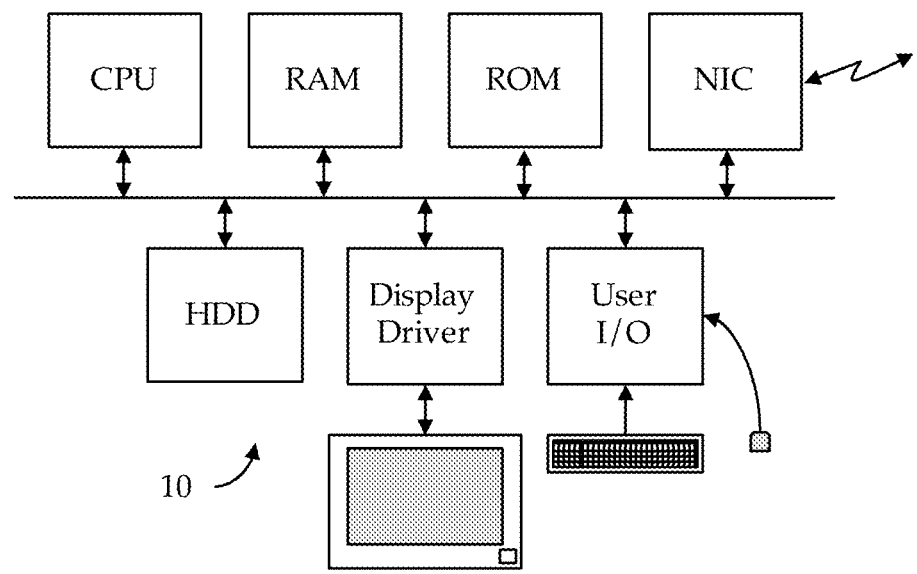
FIG. 1 illustrates, in block diagram form, a general purpose computer system adapted to instantiate any of the several embodiments.
Figure 2:
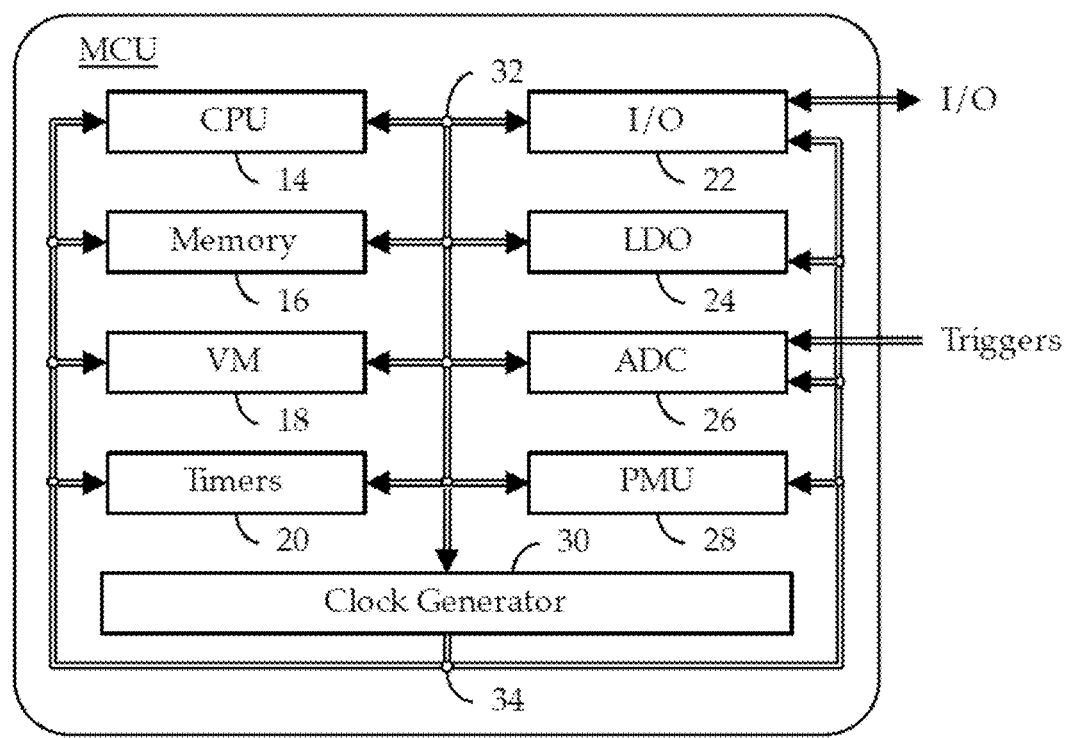
FIG. 2 illustrates, in block diagram form, a typical integrated system adapted to practice any of the several embodiments.
Figure 3:
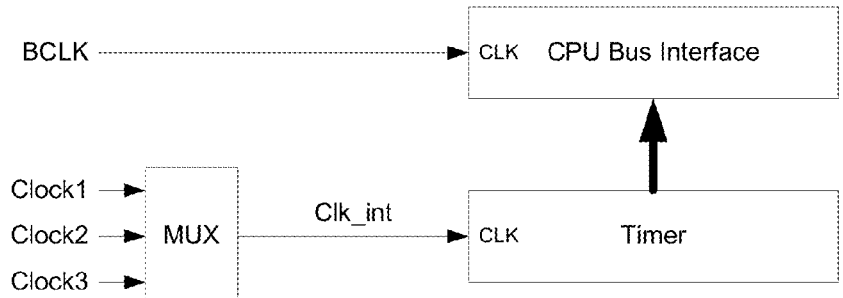
FIG. 3 illustrates, in block diagram form, a typical timer facility configuration.
Figure 4:
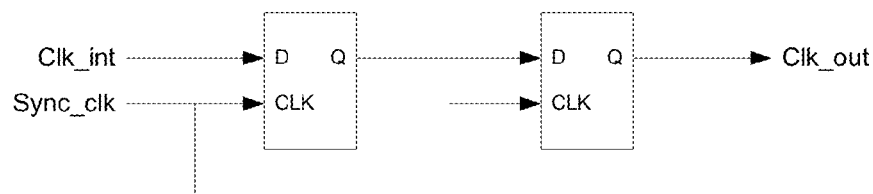
FIG. 4 illustrates, in block diagram form, a continuously running clock synchronization facility.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION

Low Power Method for Precisely Reading an Asynchronous Counter

Figure 5:
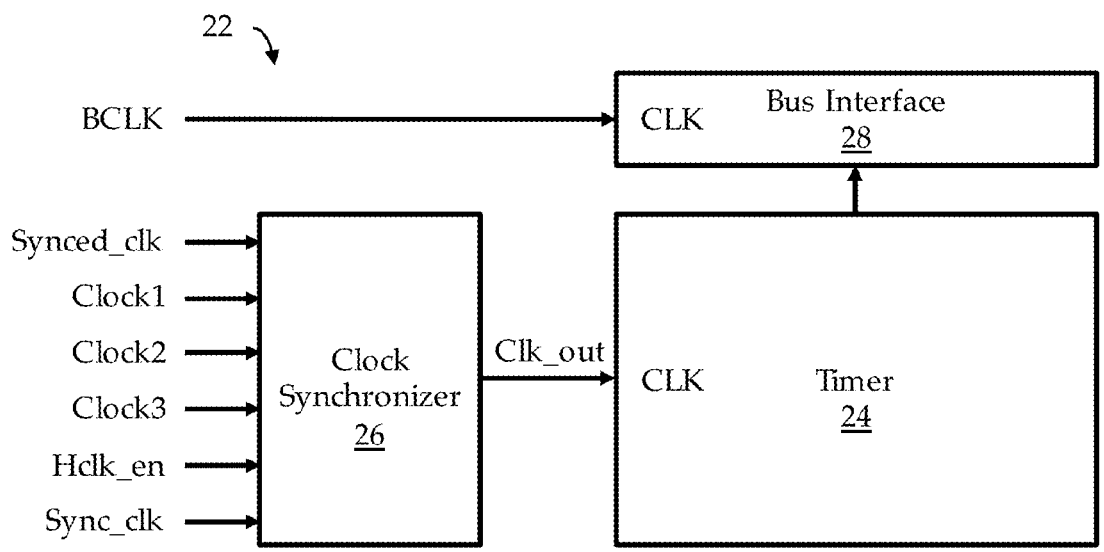
FIG. 5 illustrates, in block diagram form, a typical integrated timer facility adapted to practice any of the several embodiments.

FIG. 5 illustrates, in block diagram form, a typical integrated timer facility 22 adapted to practice any of the several embodiments. Similar to the earlier discussion, here, the Timer 24 is an N-bit counter which may be loaded with some initial value, and which then counts clock pulses from a selected clock source. And as before, it is desirable that the value in the Timer 24 may be read at any time, even when the Timer 24 is being clocked. The clock synchronizer facility 26 provides the clock synchronizing means for Timer 24 to count and to provide the count data from the Timer 24 to the Bus Interface 28 even when the Timer 24 is being clocked, when Clock1, Clock2, and Clock3 are asynchronous to BCLK, and when BCLK is not active.

Figure 6:
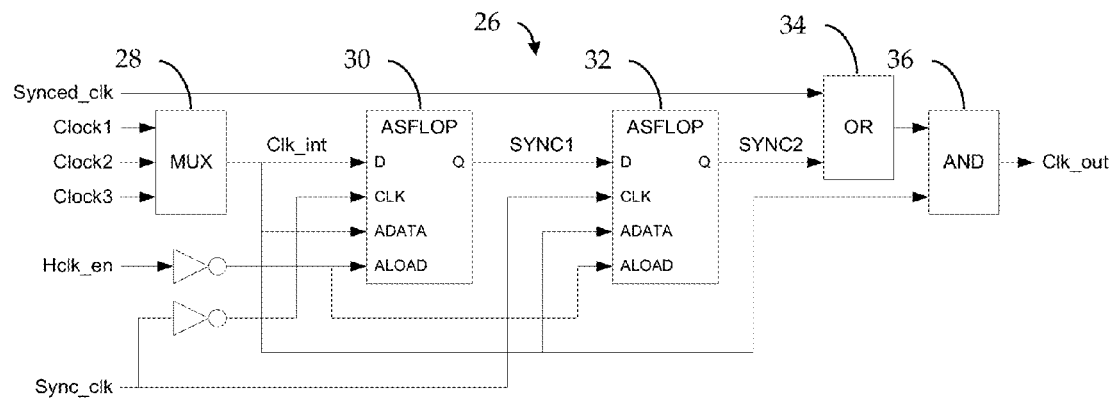
FIG. 6 illustrates, in block diagram form, a clock synchronization facility according to one embodiment.
Figure 7:
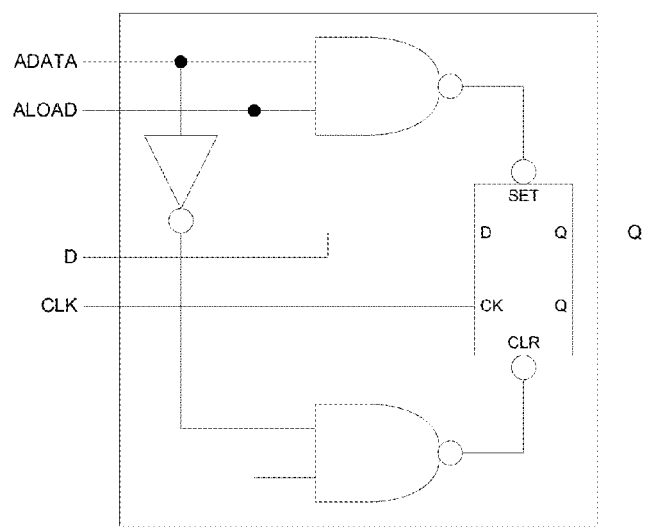
FIG. 7 illustrates, in schematic form, one embodiment of the ASFLOPs embodied in the clock synchronization facility of FIG. 6.

FIG. 6 illustrates, in block diagram form, a clock synchronization facility 26 according to one embodiment. The clock synchronization facility 26 includes mux 28, ASFLOP flip-flop facility ("ASFLOP") 30 and ASFLOP 32, OR gate 34, and AND gate 36. FIG. 7 illustrates, in schematic form, one embodiment of the ASFLOP 30 and 34 embodied in the clock synchronization facility 26 of FIG. 6. Referring to FIG. 7, this illustrated embodiment of the ASFLOP has both a normal synchronous load and an asynchronous load capability, as understood by one of ordinary skill in the art of integrated circuit design. During synchronous operation, the D flip-flop output Q is assigned the value on the input D on a rising edge of the input CLK, similar to the operation of a standard flip-flop. However, if the ALOAD input is asserted, the output Q is assigned the value on the input ADATA, independent of the signals D or CLK. When ALOAD is de-asserted, the output Q retains its then current value. According to this embodiment, the ASFLOP uses a normal D flip-flop and logic gates, but other implementations are also possible.

Referring back to FIG. 6, the mux 28 selects between various timer clocks, here illustrated as Clock1, Clock2, and Clock3, and provides an internal timer clock, here illustrated as Clk_int. Hclk_en is asserted when BCLK and Sync_clk are active. When Hclk_en is asserted, the asynchronous load capability of the ASFLOP 30 and ASFLOP 32 is disabled and the two flip-flops synchronize Clk_int to produce SYNC2. More specifically, ASFLOP 30 develops the SYNC1 signal by driving the value of Clk_int on to the signal SYNC1 on the rising edge of the CLK input of ASFLOP 30. ASFLOP 32 develops the SYNC2 signal by driving the value of SYNC1 on to the signal SYNC2 on the rising edge of the CLK input of ASFLOP 32. When Hclk_en becomes de-asserted, the asynchronous load capability of the ASFLOP 30 and ASFLOP 32 is enabled, and the the two ASFLOPs simply pass the value of Clk_int through to the SYNC2 output, although with a small delay. More specifically, ASFLOP 30 develops the SYNC1 signal by driving the value of Clk_int on to the signal SYNC1. ASFLOP 32 develops the SYNC2 signal by driving the value of SYNC1 on to the signal SYNC2. SYNC2 then propagates through OR gate 34 and is merged with the internal timer clock Clk_int at AND gate 36, producing the final output Clk_out which goes to the Timer. This insures that there are no pulses added or deleted during transitions on Hclk_en even if it is asynchronous to Clk_int. There are a number of cases to be examined to verify this guarantee.

Figure 8:
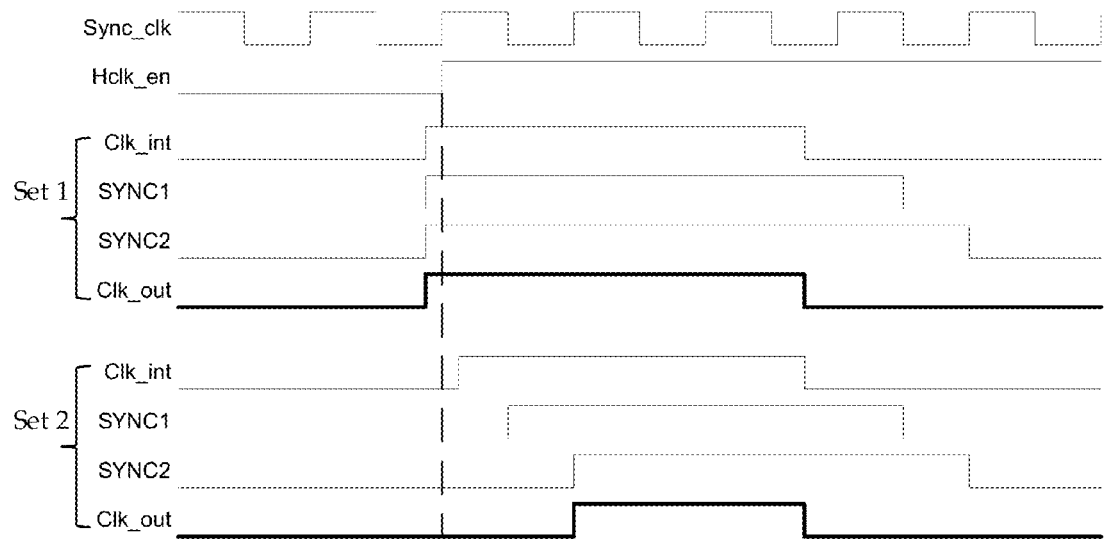
FIG. 8 illustrates, in timing diagram form, an exemplary timing diagram.

FIG. 8 illustrates, in timing diagram form, an exemplary timing diagram for the case where assertion of Hclk_en is near a rising edge of Clk_int. The first set of signals, illustrated here as Set 1 and include Clk_int, SYNC1, SYNC2, and Clk_out, is a first case where the rising edge of Clk_int arrives just before the assertion of Hclk_en. In this first case, case SYNC1 and SYNC2 follow Clk_int, and the output AND gate produces a clock which is the same as Clk_int. The second set of signals, illustrated here as Set 2, illustrates a second case where the rising edge of Clk_int arrives just after the assertion of Hclk_en. In this case SYNC1 and SYNC2 have stopped following Clk_int, and Clk_out does not have a rising edge until SYNC2 rises. Note that it is only necessary that no Clk_out pulses be added or deleted, and that the movement of an edge is acceptable.

Figure 9:
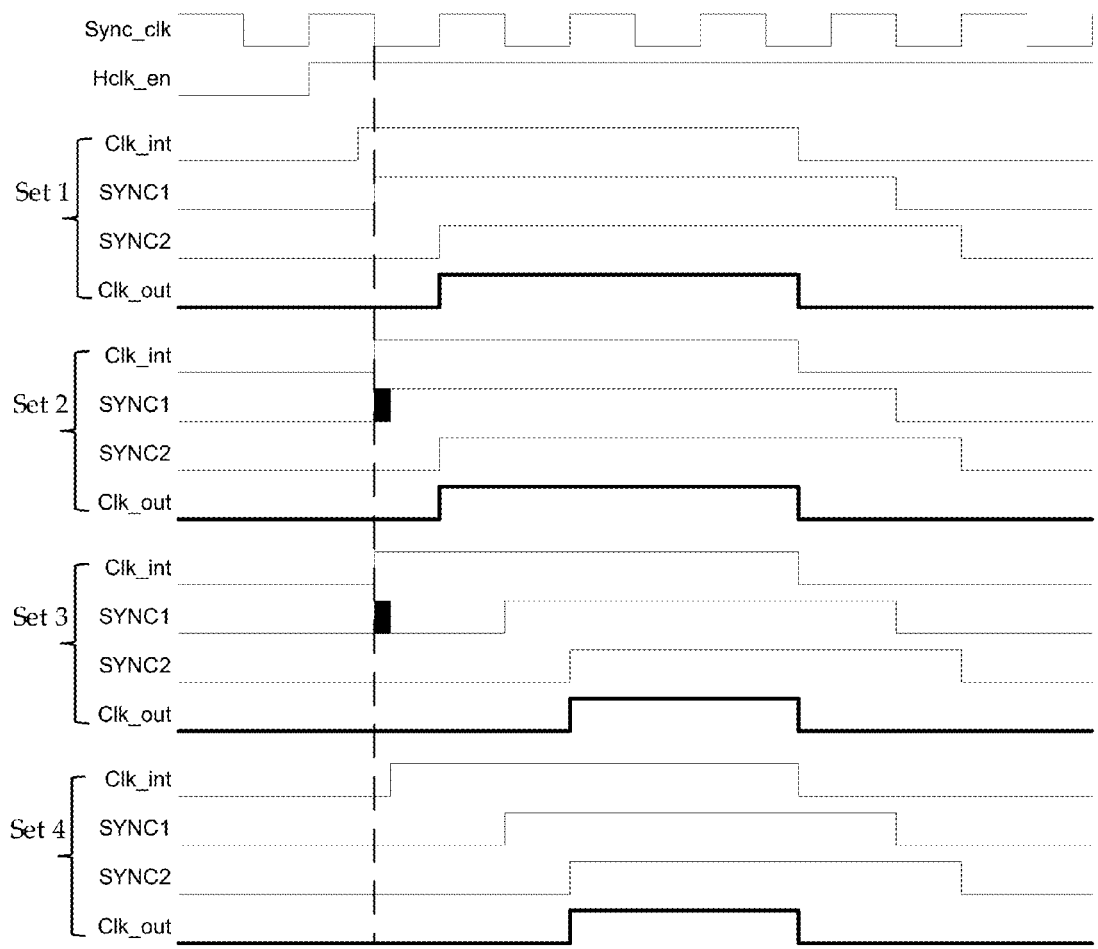
FIG. 9 illustrates, in timing diagram form, another exemplary timing diagram.

FIG. 9 illustrates, in timing diagram form, another exemplary timing diagram for the cases where Hclk_en occurs before the rising edge of Clk_int, but that rising edge occurs near the next falling edge of Sync_clk. There are several cases to analyze. The first set of signals, illustrated here as Set 1, is a first case where Clk_int occurs enough earlier than the falling edge of Sync_clk that it is synchronously sampled, and the rising edge of Clk_out is generated by SYNC2. The second set of signals, illustrated here as Set 2, and the third set of signals, illustrated here as Set 3, are the second and third cases where the rising edge of Clk_int fails to meet setup or hold requirements for the SYNC1 ASFLOP, in which case the output could momentarily oscillate as shown by the black rectangle. It is essential in this circuit that such instability does not propagate to Clk_out, and, as illustrated, it does not. SYNC1 may settle to a logic_1, illustrated in Set 2, or may settle to a logic_0, illustrated in Set 3, after the unstable period, but in either situation, Clk_out is captured correctly. The fourth set of signals, illustrated here as Set 4, is a fourth case where the edge of Clk_int is not captured in SYNC1, so the SYNC1/SYNC2/Clkout sequence occurs on the next cycle of Sync_clk.

Figure 10:
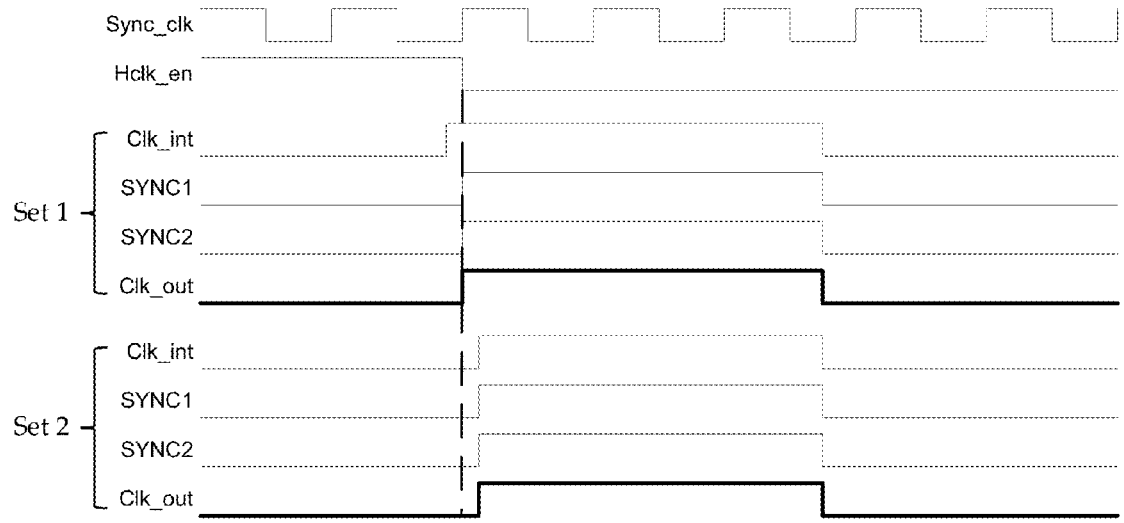
FIG. 10 illustrates, in timing diagram form, another exemplary timing diagram.

FIG. 10 illustrates, in timing diagram form, another exemplary timing diagram where Hclk_en is de-asserted near the rising edge of Clk_int. The first set of signals, illustrated here at Set 1, is a first case where Clk_int rises before Hclk_en, so the rising edge of Clk_out is generated by the falling edge of Hclk_en as it enables the asynchronous loads of SYNC1 and SYNC2. The second set of signals, illustrated here as Set 2, is a second case where Clk_int rises after Hclk_en, so the rising edge of Clk_out is generated by the rising edge of Clk_int. Because the signals are combined in an AND gate, the clock transitions will be clean independent of the actual source of the clock edge.

Referring back to FIG. 6, the falling edge of Clk_out is always generated by the falling edge of Clk_int due to the AND gate 36 structure and the signal SYNC2 is always delayed from Clk_int by the intervening circuit structures. As one of ordinary skill in the art of integrated circuit design understands, the falling edge of Clk_out will never have any unexpected transitions.

There may be some cases where the clock selected for Clk_int is generated from the same clock source as BCLK and is synchronous to it. This clock may also be the same frequency as Sync_clk. As is known, in this case, the Clk_int cannot be correctly synchronized by the disclosed ASFLOP 30/ASFLOP 32/OR gate 34/AND gate 36 structure. In this case the signal Synced_clk is asserted, which, via OR gate 34, forces Clk_out to be equivalent to Clk_int, without requiring any multiplexors which could cause glitches in other cases.

The clock synchronization facility of FIG. 6 may be applied in any environment where a module includes local circuitry which may be clocked by a clock that is asynchronous to a system clock, where that system clock may be disabled, but where the local data must be read synchronously to the system clock when it is not disabled. An example is an IO interface module which contains circuitry which is clocked by the external, asynchronous interface clock. It is desirable for the external device to access memory or registers within the module when the system clock is not active, but the system must access the same registers or memory synchronously to the system clock when it is running In this environment the register/memory logic must run on the asynchronous external clock at some times and the internal system clock at other times, with the switching controlled by the enable of the system clock.

Low Power Method for Precisely Reading Multiple Word Asynchronous Counter

Many systems include counters which can be read over a system bus as discussed above, but where those counters are wider than a single word and thus require multiple bus accesses to read the entire counter. The multiple accesses required to read the entire counter may occur separated in time, particularly if an interrupt occurs in the interim. In addition, the clock of the counter may be asynchronous to the clock of the bus system executing the read operation. In low power applications, the clock of the bus system may be turned off while the counter continues to count. Thus, what is needed is an apparatus and method for reading such a counter which guarantees that all of the counter words are consistent.

Figure 11:
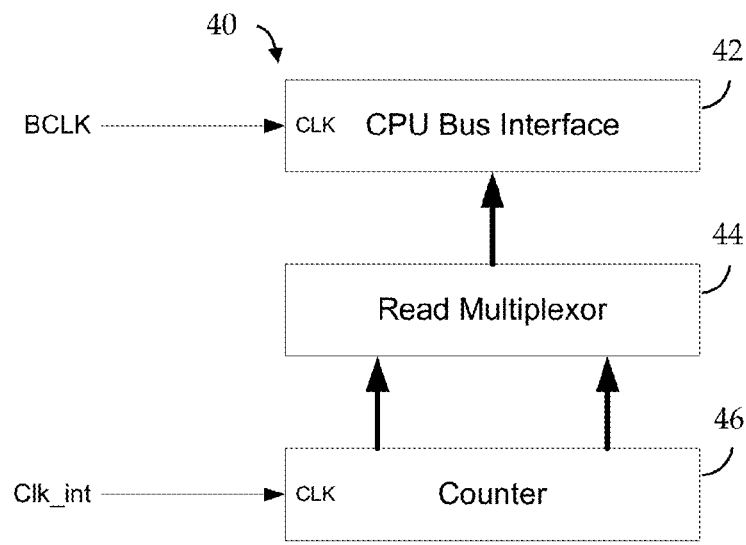
FIG. 11 illustrates, in block diagram form, an asynchronous interface unit for reading multiple word asynchronous counters according to one embodiment.

FIG. 11 illustrates, in block diagram form, an asynchronous interface unit 40 for reading multiple word asynchronous counters according to one embodiment. The CPU Bus interface 42 is clocked by a clock BCLK, and the Counter 46 is clocked by a clock Clk_int which may be asynchronous to BCLK. Counter is wider than the CPU Bus Interface 42, so there must be a multiplexor 44 to allow separate reads of the upper and lower sections of the Counter 46. BCLK may be stopped at any time to reduce power.

Figure 12:
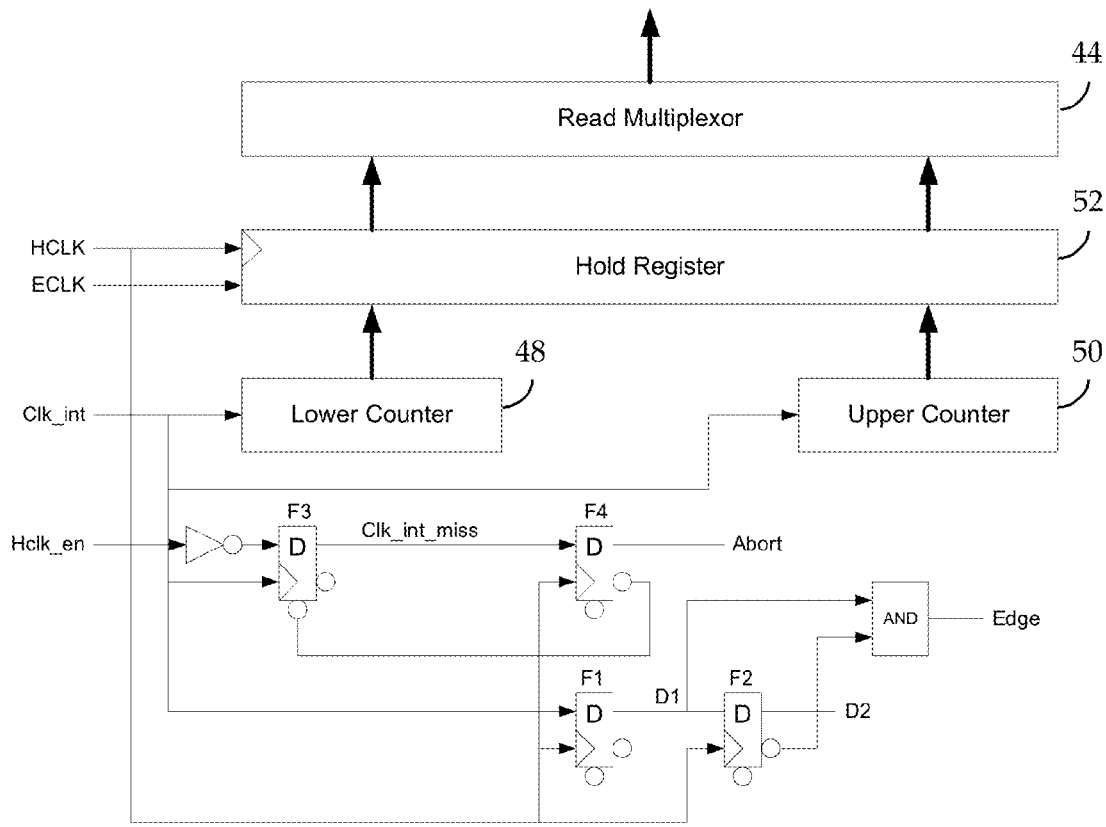
FIG. 12 illustrates, in block diagram form, one embodiment of the apparatus for reading multiple word asynchronous counters.
Figure 13:
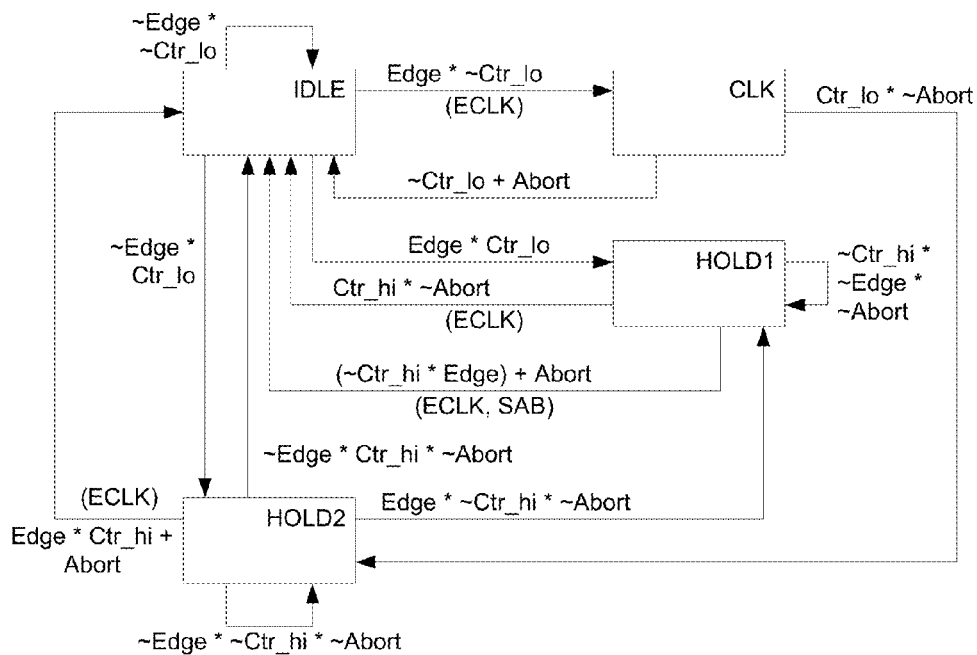
FIG. 13 illustrates, in flow chart form, the state machine of the embodiment illustrated in FIG. 12.

FIG. 12 illustrates, in block diagram form, a more detailed embodiment of the asynchronous interface unit 40 for reading multiple word asynchronous counters illustrated in FIG. 11. FIG. 13 illustrates, in flow chart form, the state machine of the embodiment illustrated in FIG. 12 Referring back to FIG. 12, the Lower Counter 48 and Upper Counter 50 are clocked by Clk_int, which, according to this embodiment, is assumed to be asynchronous to BCLK, which is also illustrated as HCLK. Two sections of the Counter are shown but, as is known, the implementation could be extended to additional Counter sections. The Hold Register 52 is loaded from the Counter sections on the rising edge of HCLK when the signal ECLK from the state machine is asserted, so the read data is always synchronous to HCLK.

Referring to FIG. 12, the flip-flops F1 and F2 synchronize Clk_int to HCLK, and produce a pulse edge which is one HCLK period wide. This allows the state machine to respond to a rising edge of Clk_int. As is known, the falling edge could also be selected. This embodiment assumes that the Lower Counter 48 and Upper Counter 50 are stable within one (1) HCLK period after the rising edge of Clk_int, but additional delay flip-flops could be added if necessary to insure Lower Counter 48 and Upper Counter 50 are stable when Edge is asserted.

Referring to FIG. 13, the state machine receives four inputs—(i) the Edge signal as described above, (ii) signals Ctr_lo, (iii) Ctr_hi, each which are asserted during a HCLK cycle in which the Lower Counter 48 or Upper Counter 50 is being read by the CPU, and an (iv) Abort signal which will be described below. It is assumed that when the sections of the Counter are to be read, the Lower Counter 48 must be read first.

The state machine is normally in the IDLE state. If Edge occurs when Ctr_lo is not asserted, the machine moves to the CLK state and asserts ECLK so that the Hold Register 52 is loaded with the values from the Lower Counter 48 and Upper Counter 50. In the CLK state, if Ctr_lo is not asserted in the CLK state the machine simply returns to IDLE, with a valid Counter value in the Hold Register 52. If Ctr_lo is asserted in the CLK state, the state machine goes to state HOLD2 to wait for the read of the Upper Counter 50.

If Edge is asserted in the IDLE state at the same time as Ctr_lo, software has tried to read the Counters just as they were incremented. In this case the Hold Register must not be updated yet, so the state machine goes to the HOLD1 state and waits for a read of the Upper Counter 50. When this read happens and Ctr_hi is asserted, the state machine returns to the IDLE state.

If Ctr_lo is asserted in state IDLE without Edge, the CPU has initiated a read and the Hold Register 52 is stable. The state machine goes to state HOLD2 to wait for the read of the Upper Counter 50. If Ctr_hi occurs in state HOLD2, the state machine returns to IDLE since both Lower Counter 48 and Upper Counter 50 have been read. If Edge occurs on the same cycle as Ctr_hi, the state machine also returns to IDLE but ECLK is generated to update the Hold Register 52. If Edge occurs before Ctr_hi, the state machine goes to state HOLD1 and continues to wait for Ctr_hi. Thus HOLD1 is the state waiting for Ctr_hi when there is a pending Counter increment, and HOLD2 is the state waiting for Ctr_hi when there is not a pending Counter increment.

The above description assumes that Abort is not asserted, which is the case for normal operation. There are two critical cases where the above sequence does not work. The first case is one where the CPU has read the Lower Counter 48, a Counter increment is pending so the state machine is in state HOLD1, and Edge is asserted again. This occurs when the software has waited so long that two edges of Clk_int have occurred between reading the Lower Counter 48 and Upper Counter 50. In this case the value of the Upper Counter 50 which corresponds to the value previous read from the Lower Counter 48 is provided, but the SERR signal is asserted which sets an Error register bit to indicate that the Counter value is old. This bit may be read by software (ideally as part of the Upper Counter 50 read data) or may generate an error interrupt.

The other critical case occurs when the CPU clock goes away between the Lower Counter 48 and Upper Counter 50 reads. Referring to FIG. 12, flip-flop F3 samples the signal Hclk_en, which indicates that the CPU clock is stopped, on Clk_int. If the clock is disabled for at least one rising edge of Clk_int, the signal Clk_int_miss will be asserted. When BCLK resumes, flip-flop F4 will be set and the Abort signal will be asserted on the next rising edge of HCLK.

If Abort is asserted, the state machine is forced back to the IDLE state. If a Lower Counter 48 read had occurred and the state machine was in the HOLD1 or HOLD2 state, SERR is asserted to set the Error register bit. The Error bit is cleared by a read from either the Lower Counter 48 or Upper Counter 50, so that if software has previously abandoned the full Counter read and reads the Lower Counter 48, the error indication will be cleared since no inconsistent data has been read.

Speed vs. Power Tradeoffs in Ripple Counters

Ripple counters provide significant improvements in power relative to synchronous counters, but they introduce long delays from the input clock to stable count values. As an example, the counter described in the first section above could be a ripple counter, but the maximum clock to output delay may limit the maximum length counter which may be supported. This invention provides a method for reducing the delay of the counter while maintaining much of the power advantage.

Figure 14:
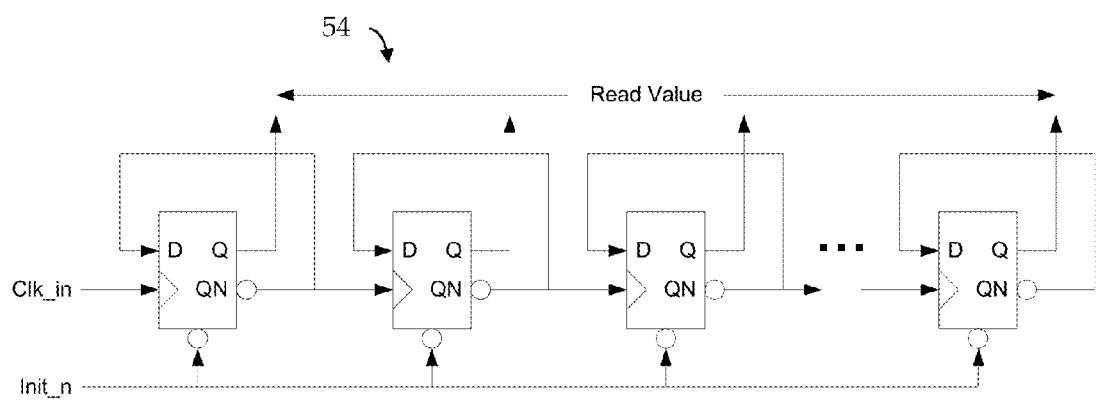
FIG. 14 illustrates, in block diagram form, a Ripple Counter.

There are two main methods of implementing a counter which counts pulses and allows the number of pulses to be read. FIG. 14 illustrates, in block diagram form, a Ripple Counter 54 as would be understood by one of ordinary skill in the art of integrated circuit design. All flip-flops are initialized to zero, and then on the first rising edge on Clk_in the first flip-flop toggles from 0 to 1. On the next clock the first flip-flop toggles from 1 to 0, which causes its QN output to toggle from 0 to 1 and the second flip-flop toggles from 0 to 1. This continues, so that after N clocks the Read Value will contain a unique value which is the number of clocks. Note that there are other well-known, similar configurations of this structure.

The Ripple Counter 54 is a very power efficient structure. The first flip-flop consumes the full power since it receives every edge of Clk_in. The second flip-flop only toggles at ½ of this rate, and thus dissipates ½ the power. The third flip-flop receives ¼ of the clocks and dissipates ¼ of the power and so on. Thus the effective power dissipation of this structure (for N flip-flops) is:

$$\text{Power}=1+\frac{1}{2}+\frac{1}{4}+\frac{1}{8}+\frac{1}{16}+ \ldots +1/(2^{(N-1)}) \sim =2 \text{ equivalent flip-flops} \quad [\text{Eq. 1}]$$

However, because the edge which toggles the last flip-flop ripples through N-1 other flip-flops, the worst case delay to the Read Value output is (N−1) times the delay of a single flip-flop. For large N values and/or systems with slow logic gates, this may be an unacceptable delay.

Figure 15:
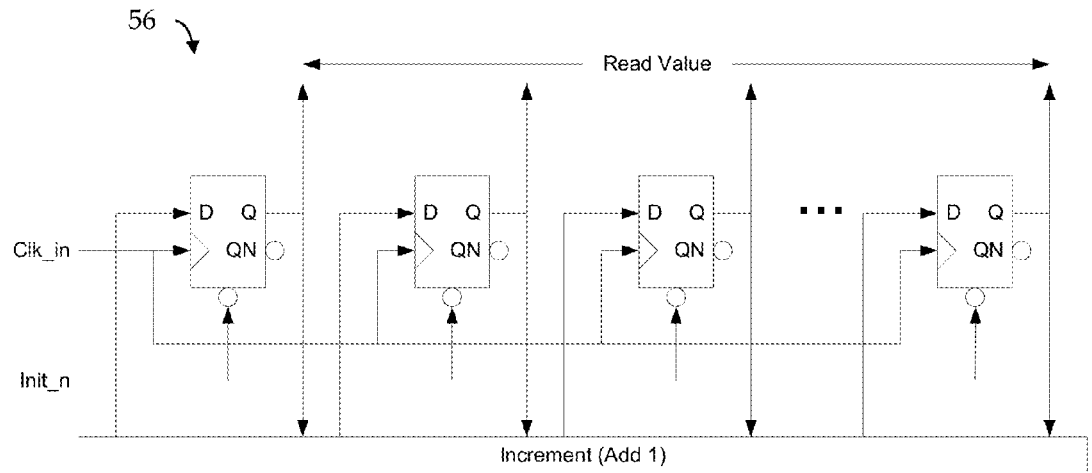
FIG. 15 illustrates, in block diagram form, a Synchronous Counter.

FIG. 15 illustrates, in block diagram form, a Synchronous Counter 56 as would be understood by one of ordinary skill in the art of integrated circuit design. In this case all of the flip-flops receive Clk_in, so the effective power dissipation for this structure is N equivalent flip-flops. However, the read data does not ripple through any additional flip-flops, so the delay to the worst case Read Value is just the delay of a single flip-flop. There is also significant complexity in the Increment function relative to a Ripple Counter 54, but this structure does provide much better performance at a significant power penalty.

Figure 16:
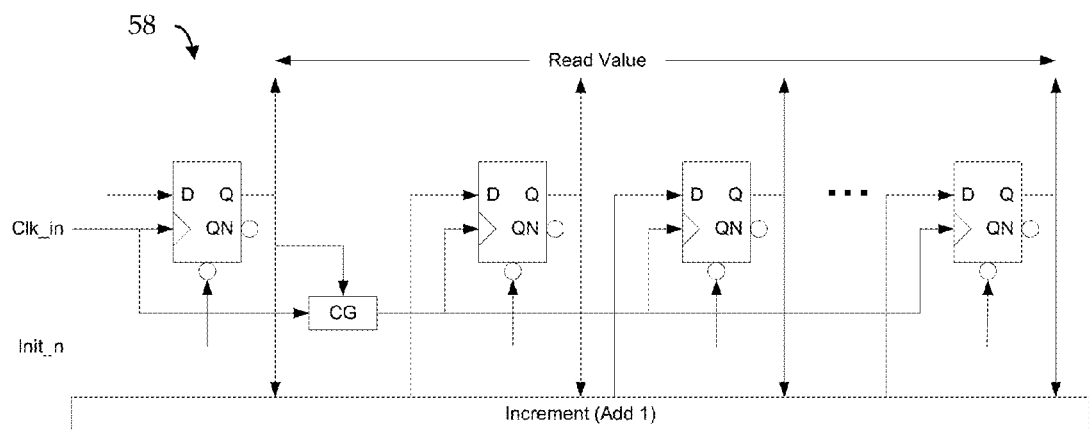
FIG. 16 illustrates, in block diagram form, an optimization of the Synchronous Counter of FIG. 15.

FIG. 16 illustrates, in block diagram form, an optimized Synchronous Counter 58 as would be understood by one of ordinary skill in the art of integrated circuit design, an optimization of the Synchronous Counter of FIG. 15. According to this embodiment, a Clock Gate (CG) cell is inserted in the clock which goes to all flip-flops except the first one. In this case the first flip-flop and the CG cell receive the input clock Clk_in, but the CG cell only allows the clock to pass when the first flip-flop has a value of 1, so all of the other flip-flops see only ½ of the clock edges. Thus the effective power dissipation of this structure is $$\text{Power}=1 \text{ (first flip-flop)}+1 \text{ (CG cell)}+(N-1)*\frac{1}{2} \text{ equivalent flip-flops.} \quad [\text{Eq. 2}]$$

The delay of the CG cell can be neglected, so the worst case Read Value delay is still 1 flip-flop delay.

Figure 17:
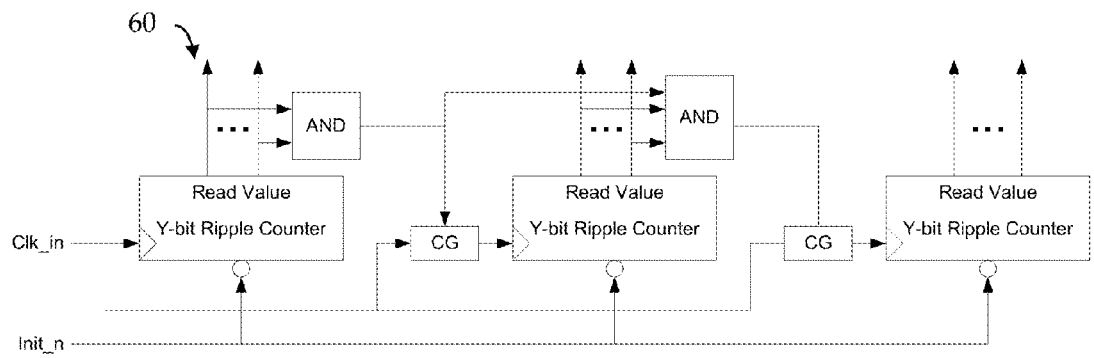
FIG. 17 illustrates, in block diagram form, a Lookahead Ripple Counter according to one embodiment.

FIG. 17 illustrates, in block diagram form, a Lookahead Ripple Counter 60 according to one embodiment. The Lookahead Ripple Counter 60 is a way to combine the previously discussed techniques to create a counter which uses much less power (and fewer logic gates) than a Synchronous Counter 58 but which has better worst case delay than a normal Ripple Counter 54. The approach breaks the full Ripple Counter 54 into multiple counters, each of which is a standard (but shorter) Ripple Counter.

The N-bit Ripple Counter 54 is broken into M pieces of length Y, so that N=M×Y. The clock to the second Ripple Counter occurs every 1/(2^Y) clocks, which is the same as in a normal Ripple Counter, and the same is true for each subsequent segment. The effective power dissipation of this structure is:

$$\text{Power}=2 \text{ (the equivalent Ripple Counter)}+(M-1) \text{ (the CG cells)} \quad [\text{Eq. 3}]$$

Thus it can be seen that the power is only slightly higher than for a normal Ripple Counter. The worst case delay is Y flip-flop delays. By adjusting the selection of Y, tradeoffs are easily made between power and Read Value delay. Table 1 below shows the tradeoff for a 32-bit counter for various implementations. The typical approach would be to select the maximum Y which meets the delay requirement, and this will result in the minimum power implementation.

TABLE 1

LookAhead Ripple Counter Tradeoffs

| Type | Y | M | Power | Delay |
| --- | --- | --- | --- | --- |
| Full Ripple | N/A | N/A | ~2 | 32 |
| Synchronous | N/A | N/A | 32 | 1 |
| CG Synchronous | N/A | N/A | 17.5 | 1 |
| Lookahead Ripple | 8 | 4 | ~5 | 8 |
| Lookahead Ripple | 11 | 3 | ~4 | 11 |
| Lookahead Ripple | 4 | 8 | ~9 | 4 |

Method to Enable Oscillator and Clock Sources During Ultra-Low Power Device Operations Microcontroller processors are designed to accept external stimulus which brings them out of a low power mode in order to enable instruction execution. Current designs do this by sampling the possible wakeup sources with a continuously running clock. This requires a constantly enabled clock source (or low or high frequency) be present to perform this sample operation.

Figure 18:
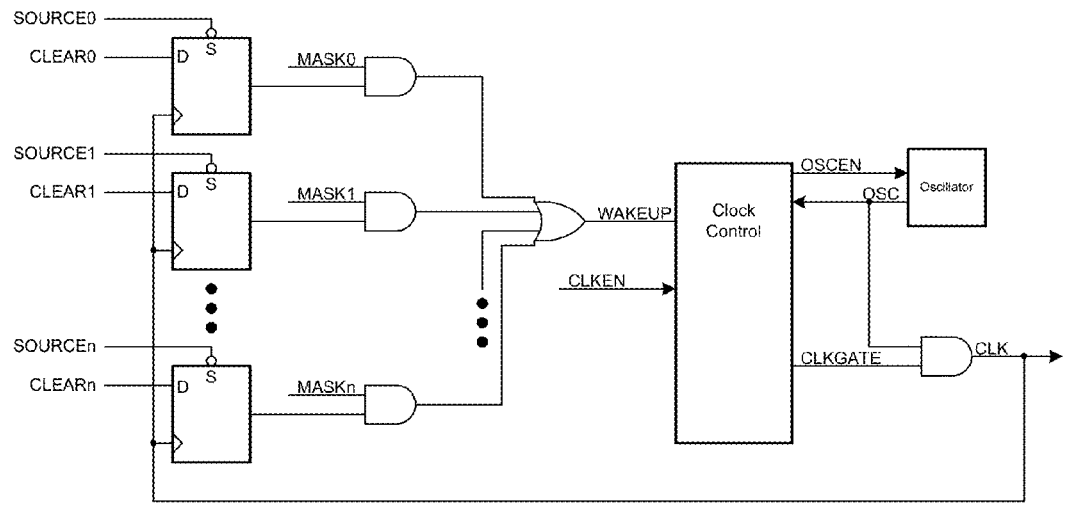
FIG. 18 illustrates, in block diagram form, a wake up monitoring facility according to one embodiment.

This constantly enabled clock source itself consumes considerable amounts of power within the Microcontroller. The objective is to reduce that to the minimal amount of power. By removing the requirement to continuously sample the wakeup sources we can remove the requirement that the clock source be constantly running FIG. 18 illustrates, in block diagram form, a wake up monitoring facility 62 according to one embodiment. The illustrated wake-up monitoring facility removes the need for continuous sampling. The SOURCE signals are asynchronous to the flip-flops, but they do not cause timing concerns because the clock that will drive the clock pins and they sample the clear signals is inactive when the oscillator is off. The 'clear' signals are generated by instructions executed by the processor core, thus they cannot happen until well after the clock is re-enabled.

Programmable Digital Method for Insuring RC Oscillator Stability

Many processing systems use RC oscillators for low power, and in addition turn those oscillators off whenever possible to reduce power even further. One challenge in this environment is that the oscillator may be take some time to begin oscillating, and may also oscillate faster or slower than the desired frequency for some time after they are powered on. A digital method is described which allows the final output of the oscillator to conform to stringent frequency specifications even when it is powered on.

Figure 19:
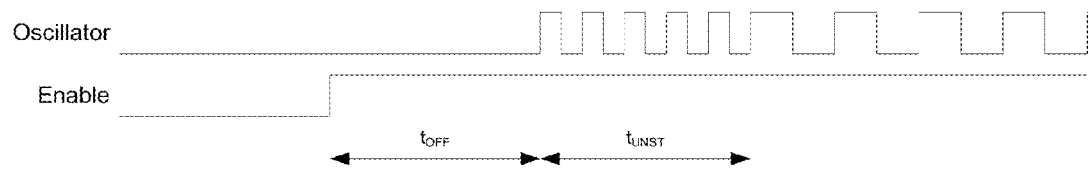
FIG. 19 illustrates, in timing diagram form, an RC oscillator startup.

FIG. 19 illustrates, in timing diagram form, an RC oscillator startup. Output is the oscillator output, and Enable is the power enable signal. After Enable is asserted, the oscillator typically waits for some time tOFF before it begins to oscillate. Once it begins to oscillate, the frequency will often be different from the desired frequency for a time tUNST before settling into the correct frequency. The unstable period frequency may be either higher or lower than the desired frequency. Here, it is illustrated at a higher frequency because that is the situation which could cause problems in the circuitry utilizing the clock.

Figure 20:
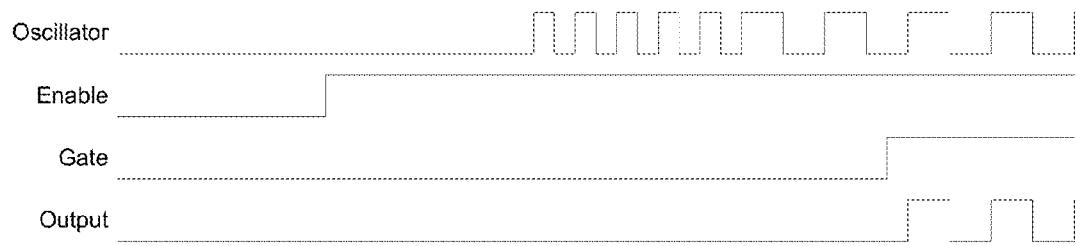
FIG. 20 illustrates, in timing diagram form, one modification of an RC oscillator startup.

FIG. 20 illustrates, in timing diagram form, one modification of an RC oscillator startup. This modification gates the oscillator output until the output is stable. After Enable is asserted, the signal Gate is used to keep the actual Output low until the Oscillator is stable. The generation of the Gate signal has a significant effect on the power dissipated by the oscillator circuit, and a high frequency oscillator is an important component of overall power dissipation in systems focused on low power. The oscillator is wasting power during the period when it is running but gated, so that period should be as short as possible, but it is also critically important that the Gate signal not occur before the Oscillator output is stable. Since this oscillator may be the only one in the system, the solution cannot depend on another oscillator to provide the timing of the Gate signal.

As is known, one method of generating the Gate signal is to provide an analog delay, typically using some type of RC delay circuit, to create the Gate signal. However, there are disadvantages to this implementation. A first disadvantage is that RC delay circuits are typically not extremely accurate, so the delay must be set so that the absolute minimum delay to the assertion of Gate is longer than the maximum sum of $t_{OFF}$ and $t_{UNST}$. This tends to imply that in most cases the delay will be significantly longer than what is actually required, meaning that the Oscillator will be running longer than it needs to before actual operation begins and power will be wasted. A second disadvantage is that for low power operation, the RC delay circuit will typically power up at the same time as the Oscillator and this type of circuit can itself be somewhat unstable as power is applied. Thus careful design is necessary to insure that there is not an unexpected assertion of Gate before the Oscillator is stable.

Figure 21:
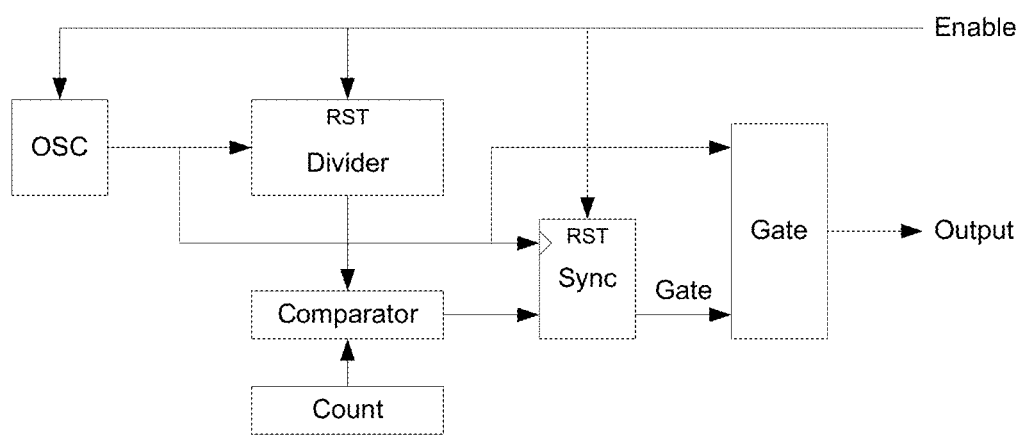
FIG. 21 illustrates, in block diagram form, a digital RC Gate signal generating facility, according to one embodiment.

FIG. 21 illustrates, in block diagram form, a digital RC Gate signal generating facility, according to one embodiment. This embodiment uses a digital implementation to create the Gate signal. As will be seen, this produces a low power solution which is programmable and minimizes the power wasted in this function.

In this implementation, the Oscillator OSC drives a digital divider. In the preferred embodiment this is a ripple divider which is the optimal power implementation, although other less power optimized solutions such as a synchronous divider may also be used. This Divider and a synchronization circuit Sync are reset to zero when the Oscillator is disabled (Enable is deasserted). Once Enable is asserted, the Oscillator will begin generating clocks and the Divider will begin counting. The output of the Divider is compared to a preloaded value held in the Count register. When the Divider becomes equal to Count, the Sync flip-flop is set on the next clock, and the Gate signal is asserted. This then allows the Output to begin toggling.

This proposal has several advantages over prior solutions, especially from a power perspective. First, because the Divider begins counting as soon as the Oscillator begins toggling, it automatically optimizes Gate relative to the $t_{OFF}$ time. If that time is short, Gate will be asserted more quickly and thus will minimize the time in which the Oscillator output is stable but Gate is still low. Second, because the $t_{UNST}$ time is compared to a register value, it is easy to control the delay to optimize for that time. It is possible to measure a number of parts and select the shortest delay (the smallest Count value) which is guaranteed to hold Gate low until $t_{UNST}$ has elapsed under all environmental conditions. Third, the programmability also allows the delay to be adjusted based on other factors, for example the temperature or power supply voltage, which may affect the Oscillator power up characteristics. The initial Count value may be determine using measurements made when the component is manufactured and is held in non-volatile memory such as Flash ROM or non-volatile RAM, or may be set when the component is installed in the final application system when the operating parameters are more clearly understood.

Note that the Divider is a very simple circuit, and can easily be designed so that it is tolerant of the worst case frequency which the Oscillator can produce. This is important since the functionality depends upon correct behavior of the Divider. Note also that in many systems the oscillator must be divided in order to provide lower frequency clocks, so that the Divider often already exists.

The above architecture may also be used as part of the Power On Reset (POR) function of an integrated circuit. When power is applied to an IC, various sections of the circuitry take some time to become stable. This generally requires a delay to be inserted to insure this stability, which is often an RC delay which can require unnecessarily long delays to insure that the delay is long enough in the worst case. An oscillator can be designed power up similarly to other circuit elements, so that after some particular Count value the power up circuitry is guaranteed to be stable. The Gate signal in FIG. 21 can therefore be used to determine when power up is in fact valid.

Although described in the context of particular embodiments, one of ordinary skill in this art will readily realize that many modifications may be made in such embodiments to adapt either to specific implementations.

Thus it is apparent that a method and apparatus adapted to provides a mechanism for clocking the Timer in such a way that a single read is always guaranteed to be correct but does not require the clock source oscillator to be active in "sleeping" power states, while consuming less power than known prior art has been disclosed. Further, we submit that our method and apparatus provides performance generally superior to the best prior art techniques.

What is claimed is:

1. An apparatus comprising:
   an internal clock coupled to a synchronizer facility;
   an enable coupled to said synchronizer facility;
   a synchronous clock coupled to said synchronizer facility;
   said synchronizer facility coupled to a timer;
   said synchronizer facility being adapted to output a first synchronized clock as a function of said internal clock, said synchronous clock, and said enable; and
   said timer being adapted to count as a function of said first synchronized clock; and
   wherein said synchronizer facility is further characterized as comprising:
   a first flip-flop adapted to:
      receive said internal clock;
      receive said synchronous clock;
      receive said enable;
      output a second synchronized clock as a function of said internal clock and said synchronous clock if said enable is de-asserted; and output said second synchronized clock as a function of said internal clock and said enable if said enable is asserted;
a second flip-flop adapted to:
receive said second synchronized clock;
receive said synchronous clock;
receive said internal clock;
receive said enable;
output a third synchronized clock as a function of said second synchronized clock and said synchronous clock if said enable is de-asserted; and
output said third synchronized clock as a function of said internal clock and said enable if said enable is asserted; and
a first gating circuit adapted to output said first synchronized clock as a function of said third synchronized clock and said internal clock.

2. The clock synchronization facility of claim 1 wherein said internal clock is asynchronous to said synchronous clock.

3. The clock synchronization facility of claim 2 where said enable is asynchronous to said internal clock.

4. A method comprising:
receiving an internal clock;
receiving an enable;
receiving a synchronous clock;
developing a first synchronized clock as a function of said internal clock, said synchronous clock, and said enable; and
counting as a function of said first synchronized clock; and
wherein said developing step is further characterized as comprising the steps of:
selectively storing said internal clock as a function of:
said synchronous clock if said enable is de-asserted; and
said enable if said enable is asserted;
outputting a second synchronized clock as a function of said selectively stored internal clock;
selectively storing said second synchronized clock as a function of
said synchronous clock if said enable is de-asserted; and
said enable if said enable is asserted;
outputting a third synchronized clock as a function of said selectively stored second synchronized clock; and
developing said first synchronized clock as a function of said third synchronized clock and said internal clock.

5. The method of claim 4 wherein said internal clock is asynchronous to said synchronous clock.

6. The method of claim 5 wherein said enable is asynchronous to said internal clock.

7. A clock synchronization facility configured to perform the steps of a method according to any one of claims 4 to 6.

8. A non-transitory computer readable medium including executable instructions which, when executed in a processing system, causes the processing system to perform the steps of a method according to any one of claims 4 to 6.

* * * * *